(12) United States Patent
Saman et al.

(10) Patent No.: US 10,455,331 B2
(45) Date of Patent: Oct. 22, 2019

(54) MEMS TRANSDUCER AMPLIFIERS

(71) Applicant: Cirrus Logic International Semiconductor Ltd., Edinburgh (GB)

(72) Inventors: Hynek Saman, Beroun (CZ); James Thomas Deas, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/916,597

(22) Filed: Mar. 9, 2018

(65) Prior Publication Data

US 2018/0270588 A1 Sep. 20, 2018

Related U.S. Application Data

(60) Provisional application No. 62/472,224, filed on Mar. 16, 2017.

(30) Foreign Application Priority Data

Apr. 18, 2017 (GB) .................................. 1706080.7

(51) Int. Cl.
*H04R 19/04* (2006.01)
*H04R 19/00* (2006.01)
*H03F 3/45* (2006.01)
*H03F 3/187* (2006.01)
(Continued)

(52) U.S. Cl.
CPC ............. *H04R 19/04* (2013.01); *H03F 1/26* (2013.01); *H03F 3/187* (2013.01); *H03F 3/45475* (2013.01); *H03F 3/45636* (2013.01); *H03F 3/505* (2013.01); *H04R 19/005* (2013.01);
(Continued)

(58) Field of Classification Search
CPC ........ H03F 1/26; H03F 3/505; H03F 3/45636; H03F 3/45475; H03F 2200/03; H03F 2200/213; H03F 2201/003; H04R 19/005; H04R 19/04
See application file for complete search history.

(56) References Cited

U.S. PATENT DOCUMENTS

| 5,577,129 A | * | 11/1996 | Ehara ..................... H03F 1/30 |
| | | | 379/395 |
| 9,510,108 B2 | * | 11/2016 | Han ....................... H04R 19/04 |
| 2008/0089536 A1 | | 4/2008 | Josefsson |

(Continued)

FOREIGN PATENT DOCUMENTS

| GB | 2516878 A | 2/2015 | |
| GB | 2525674 A | * 11/2015 | ............. H03F 3/505 |
| GB | 2525674 A | 11/2015 | |

OTHER PUBLICATIONS

Combined Search and Examination Report of the UKIPO, Application No. GB1706080.7, dated Oct. 19, 2017.

*Primary Examiner* — Brian Ensey
(74) *Attorney, Agent, or Firm* — Jackson Walker L.L.P.

(57) ABSTRACT

An amplifier circuit has a transducer biasing node for outputting a transducer bias voltage for biasing the capacitive transducer and a signal node for receiving the input signal. An amplifier arrangement comprising a feedback resistor network provides an amplified output signal. A voltage buffer provides a buffered bias voltage at a buffer node which is connected to a terminal of the feedback resistor network, to at least partly define the quiescent level of the output signal. The buffer node is electrically coupled to the transducer biasing node via a capacitance which may form part of a bias filter.

20 Claims, 4 Drawing Sheets

(51) Int. Cl.
*H03F 1/26* (2006.01)
*H03F 3/50* (2006.01)

(52) U.S. Cl.
CPC .... *H03F 2200/03* (2013.01); *H03F 2200/213* (2013.01); *H04R 2201/003* (2013.01)

(56) References Cited

U.S. PATENT DOCUMENTS

2009/0161890 A1   6/2009  Lin
2014/0086433 A1*  3/2014  Josefsson ................ H04R 3/06
                                                                              381/98

* cited by examiner

MEMS TRANSDUCER AMPLIFIERS

FIELD

The field of representative embodiments of this disclosure relates to methods, apparatuses, or implementations concerning or relating to amplification of signals from capacitive transducers. Applications include, but are not limited to, those concerning the amplification of signals from MEMS capacitive transducers such as MEMS microphones.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices. Requirements of the mobile phone industry for example, are driving the components to become smaller with higher functionality, lower power consumption and reduced cost.

Micro-electromechanical-system (MEMS) transducers, such as MEMS microphones are finding application in many of these devices. There is therefore also a continual drive to reduce the size and cost of such MEMS microphones and to minimize the area and space taken up with such transducers, for example to enable the use of MEMS transducers that are suitable for embedding in earbuds for noise cancellation or other requirements for acousto-electrical feedback such as speaker linearization.

However the desire for reduction in physical size conflicts with the desire to provide better performance, for example regarding the level of the electronic noise floor. There may be no space available for off-chip capacitors or to provide dual-supplies to allow use of ground as a signal reference voltage or to decouple sensitive nodes with respect to ground. Also system power budgets are progressively getting smaller, and lower power tends, thermodynamically, to imply higher circuit noise levels.

Embodiments of the present disclosure relate to methods and apparatus with improved noise performance, for instance to circuits in which any contribution to noise at an output node that arises due to noise on bias voltage references is at least partly reduced or even eliminated.

EXAMPLE EMBODIMENTS OF THE PRESENT DISCLOSURE

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

According to a first aspect there is provided an amplifier circuit for amplifying an input signal from a capacitive transducer comprising:
- a transducer biasing node for outputting a transducer bias voltage for biasing the capacitive transducer;
- a signal node for receiving the input signal from the capacitive transducer;
- an amplifier arrangement coupled to the signal node to amplify the input signal and generate an output signal at an output node, the amplifier arrangement comprising a feedback resistor network;
- a voltage buffer configured to generate a buffered bias voltage at a buffer node; wherein a terminal of the feedback resistor network is electrically coupled to the buffer node to receive said buffered bias voltage; and
- a first capacitance is electrically coupled between the transducer biasing node and the buffer node.

In some embodiments the amplifier arrangement may comprise an input transistor coupled so as to be driven by the input signal at the signal node. The amplifier arrangement may also comprise a first amplifier. The feedback resistor network may comprise first and second resistors. In one arrangement the input transistor comprises: a gate terminal coupled to the signal node; a drain terminal coupled to a first input of the first amplifier; and a source terminal connected to an output of the first amplifier via the first resistor. A second input of the first amplifier may be connected to receive a defined reference voltage. The output of the first amplifier may be coupled to the output node. The first resistor may be coupled between the output of the first amplifier and the source terminal of the input transistor. The second resistor may be coupled between the buffer node and the source terminal of the input transistor.

In some implementations a first current source may be coupled to the source terminal of the input transistor for sourcing a defined current. There may be an additional resistor connected between the drain terminal of the input transistor and a defined voltage. Additionally or alternatively a first current sink may be coupled to the drain terminal of the input transistor for sinking a defined current.

The voltage buffer may comprise a buffer transistor coupled to be driven an input quiescent bias voltage. In one arrangement the voltage buffer also comprises a second amplifier. A gate terminal of the buffer transistor may be coupled to receive the input quiescent bias voltage, a drain terminal of the buffer transistor may be coupled to an input of the second amplifier; and a source terminal of the buffer transistor may be coupled to the output of the buffer amplifier and also to the buffer node. A second input of the second amplifier may be connected to receive a defined reference voltage.

The output of the second amplifier may be connected to the buffer node and the source terminal of the buffer transistor via a third resistor. In some embodiments the output of the second amplifier may be output at a complementary output node as a complementary output signal.

The signal node may, in use, be connected to a signal node bias voltage via a signal node impedance.

In some embodiments there may be a potential divider having first and second ends, the first end coupled to the signal node and configured to generate an attenuated version of the signal at the signal node. A second amplifier arrangement may be coupled to the potential divider to amplify the attenuated input signal and generate a second output signal at a second output node. The second amplifier arrangement may comprise a second feedback resistor network. A terminal of the second feedback resistor network may be electrically coupled to the buffer node to receive the buffered bias voltage. The second end of the potential divider may be electrically coupled to buffer node. The potential divider may be a capacitive potential divider.

In some embodiment the first capacitor forms part of a filter for filtering the transducer bias voltage, i.e. it may comprise a bias filter capacitance.

In use the circuit will operate with a capacitive transducer connected between the transducer biasing node and the signal node. The capacitive transducer may be a MEMS capacitive transducer. In some implementations the capacitive transducer may be integrated with the amplifier circuit in an integrated circuit. In other implementations the transducer may be formed on a separate die or chip to the amplifier circuit and connected via appropriate electrical connections.

Embodiments also relate to an electronic device comprising an amplifier circuit as described in any of the variants discussed above or below. The electronic device may be at least one of: a communications device; a mobile or cellular telephone; a smartphone device; a computing device; a laptop, notebook or tablet computer; a portable device; a battery powered device; a wearable device; a voice-operated device; a gaming device.

In another aspect there is provided an amplifier circuit for amplifying an input signal from a capacitive transducer comprising:
a signal node for receiving the input signal;
a transducer biasing node for outputting a transducer bias voltage for biasing the capacitive transducer;
a voltage buffer configured to generate a buffered bias voltage at a buffer node;
an amplifier arrangement configured to receive the input signal from the signal node and the buffered bias voltage;
wherein circuit further comprises a signal path for supplying the buffered bias voltage to the transducer biasing node via a first capacitance; and
wherein the amplifier arrangement comprises a feedback resistor network configured such that:
a change in input signal with respect to the buffered bias voltage results in a change in the output signal with respect to the buffered bias voltage with a gain greater than one; and
a change in the buffered bias voltage results in a change in the output signal with a gain equal to one.

In a further aspect there is provided an amplifier apparatus comprising:
a MEMS capacitive transducer connected between a transducer biasing node and a signal node;
an amplifier arrangement coupled to the signal node to amplify the input signal, the amplifier arrangement comprising a feedback resistor network; and
a voltage buffer configured to generate a buffered bias voltage at a buffer node;
wherein a terminal of the feedback resistor network is electrically coupled to the buffer node to receive said buffered bias voltage;
a signal path between the buffer node and the transducer biasing node comprising a first capacitor.

In a further aspect there is provided an amplifier circuit for amplifying an input signal from a capacitive transducer comprising:
a signal node for receiving the input signal;
a transducer biasing node for outputting a transducer bias voltage for biasing the capacitive transducer;
an input transistor having a gate terminal coupled to the signal node;
an amplifier having an input connected to a drain terminal of the input transistor and an output connected to a source terminal of the input transistor via a first feedback resistor;
a defined current element for defining a gate-to-drain current through the input transistor;

a voltage buffer configured to generate a buffered bias voltage at a buffer node;
a second feedback resistor connected between the buffer node and the source terminal of the input transistor; and
a first capacitance electrically coupled between the transducer biasing node and the buffer node.

Aspects also relate to an amplifier system for amplifying a signal from a capacitive transducer that is connected between a transducer biasing node and a signal node, comprising:
a bias filter capacitor comprising a first electrode and a second electrode wherein the first electrode is connected to the transducer biasing node;
an amplifier input transistor comprising:
a gate terminal connected to the signal node;
a voltage buffer comprising an output terminal connected to a source terminal of said input transistor via a resistor;
wherein the output terminal of the voltage buffer is also electrically connected to the second electrode of the bias filter capacitor.

BRIEF DESCRIPTION OF THE DRAWINGS

To explain various aspects of the present disclosure various embodiments will now be described, by way of example only, with reference to the accompanying drawings, of which.

DETAILED DESCRIPTION

Figure 1:
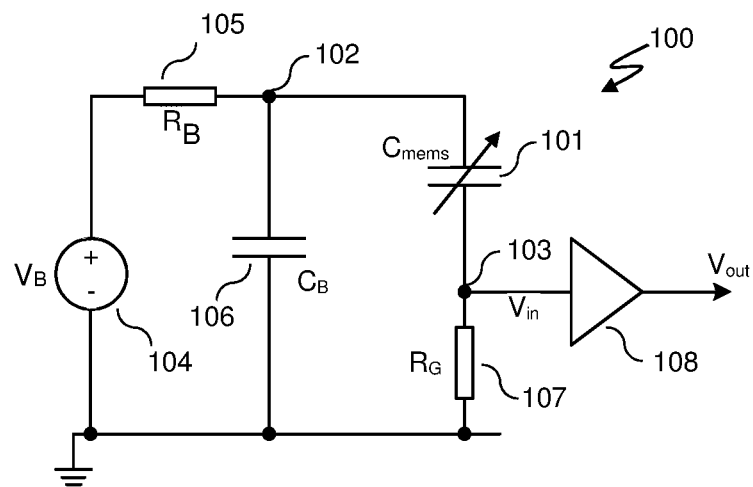
FIG. 1 illustrates an example of a capacitive transducer system.

FIG. 1 illustrates generally an amplifier system 100 for amplifying a signal from a capacitive transducer 101, in this non-limiting example a MEMS microphone transducer.

The transducer 101 is electrically connected between nodes 102 and 103 of the amplifier system. The transducer will generally comprise at least first and second electrodes wherein one of the electrodes is configured to be moveable with respect to the other electrode in response to an incident acoustic stimulus. Nodes 102 and 103 electrically connect to electrodes of the transducer, e.g. the first and second electrodes respectively. In some implementations at least some of the circuitry of the amplifier system 100 may be formed separately from the transducer 101, e.g. on a separate semiconductor die. Nodes 102 and 103 may therefore be identified as electrical bond pads or terminals for connecting the circuitry to the transducer 101. In some implementations however the amplifier circuitry may be integrated with the transducer 101 on the same semiconductor substrate, i.e. die or chip, and thus the nodes 102 and 103 may be identified as nodes in the interconnect between the circuitry and the electrodes of the transducer 101.

In use node 102 is supplied with a transducer bias voltage ($V_B$) for biasing the first electrode of MEMS transducer 101 and thus will be referred to as a transducer biasing node. The bias voltage $V_B$ is derived from a voltage source 104, for example a charge pump, and in this example is applied to the transducer biasing node 102 via a first low-pass filter comprising bias impedance 105 and bias filter capacitor 106. The bias impedance 105 is connected in a biasing path between the voltage source 104 the transducer biasing node 102 and the transducer biasing node is also electrically connected to a first electrode of the bias filter capacitor 106. The low-pass filter typically has a bandwidth substantially below the lower bound of the signal frequency range required for the transducer response, e.g. 1 Hz or lower, in order to attenuate signal-band noise from the voltage source 104 and impedance 105. Bias filter capacitor 106 may be co-integrated together with other semiconductor circuitry on a monolithic substrate and may typically have a capacitance of the order of 10 to 100 pf. Bias impedance 105 thus typically may be of the order of 1 Gohm to 1 Tohm to provide the desired cut-off, and to achieve such a high impedance may, for example, comprise at least one reverse biased diode, for example a polysilicon diode.

Node 103 is connected to the second electrode of the transducer and is connected to a defined voltage, e.g. ground, via an impedance 107 to provide a DC bias to the second electrode of the transducer. Acoustic signals incident on the microphone transducer 101 will tend to cause relative displacement of the first and second transducer electrodes, which would modulate the capacitance between these electrodes and thus cause a corresponding modulation of the signal voltage $V_{in}$ to appear on node 103 which will thus be referred to herein as a signal node. Typically the capacitance of the transducer may be of the order of 1 pf or so. The time constant of the RC network comprising the transducer capacitance 101 and the impedance 107 should correspond to a frequency at or below the lower bound of the frequency range of operation desired for the system so that impedance 107 does not shunt the signal modulation of interest. The relevant time constant may thus correspond to a frequency of the order of 1 Hz or so and thus typically impedance 107 may be of the order of 1 Gohm to 1 Tohm, and may, for example, be implemented using one or more polysilicon diodes.

The signal node 103 is also connected to the input of a buffer amplifier 108 in order to provide a signal $V_{out}$ at its output that is strong enough to drive downstream components. Buffer amplifier 108 may, for example, be a MOS source follower, or other known circuits such as super-source-followers. Such buffer amplifiers provide a gain of approximately unity. However advantageously buffer amplifier 108 may provide a voltage gain substantially greater than unity, to reduce the noise requirements on the downstream circuitry.

Figure 2:
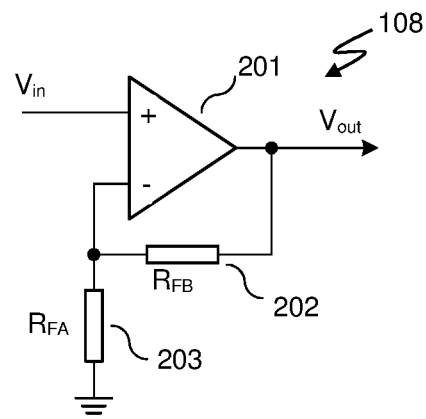
FIG. 2 illustrates an amplifier arrangement for amplifying a signal from a capacitive transducer.

FIG. 2 illustrates one example of a conventional op amp based buffer amplifier arrangement 108 with a gain greater than unity. The input voltage $V_{in}$ from the signal node 103 is applied to a high input impedance input terminal (+) of op amp 201. A feedback resistor network comprising resistors 202 and 203 of respective values $R_{FB}$ and $R_{FA}$ provides feedback to the other input terminal (−) of the op amp 201 to define a voltage gain from $V_{in}$ to $V_{out}$ of $(1+R_{FB}/R_{FA})$. Thus this amplifier arrangement 108 provides a high input impedance and also signal gain greater than unity.

However, compared to the source follower arrangement, the input-referred noise performance of this illustrated buffer amplifier arrangement 108 may be degraded. The noise of the buffer amplifier 108 may be dominated by the noise of two input transistors, i.e. a transistor associated with each of the inverting (−) and non-inverting (+) input of op-amp 201, compared to just one transistor in a source follower arrangement.

Also in many applications, for example where only a single supply voltage is provided to the buffer amplifier 108 or downstream signal processing system, it is preferable that the terminal of feedback resistor 203 which is not connected to the op amp 201 is connected to a non-zero bias voltage (and not ground as illustrated in FIG. 2), so that the output voltage $V_{out}$ may be centered around a non-zero quiescent voltage. This non-zero bias voltage thus serves to, at least partly, define the quiescent output voltage and will be referred to as a quiescent bias voltage or a quiescent reference voltage. The quiescent bias voltage is provided by a reference voltage source, which may comprise a voltage buffer (not illustrated), which may contribute noise into the system. Any such noise will be amplified by a gain equal to $-R_{FB}/R_{FA}$. For noise reasons the resistance of resistors 203 and 202 may be of the order of kilo-ohms, so any decoupling of this noise associated with the quiescent voltage bias, would require decoupling capacitance values in the order of microfarads, which in practice would not be feasible, for at least area considerations, to integrate onto a semiconductor substrate, i.e. chip. Packaged microphones are very small, with little or no space for additional pins or pads so as to electrically access an external capacitance for noise decoupling purposes. Therefore, such a capacitance implemented as a discrete off-chip component would also be undesirable in terms of, at least, system footprint in the end device.

Embodiments of the present disclosure relate to amplifier circuits and systems for a capacitive transducer that provide gain with respect to a quiescent bias voltage while removing some or all of the noise contribution attributable to a voltage reference source for defining the quiescent bias voltage. Such embodiments may advantageously relax the constraints on noise for the quiescent bias voltage may thus remove any requirement for off-chip components so as to filter noise from a reference voltage source and/or to provide a very low-noise reference voltage source, which may allow a reduction in the area or power consumption needed to generate a suitable reference voltage.

Figure 3:
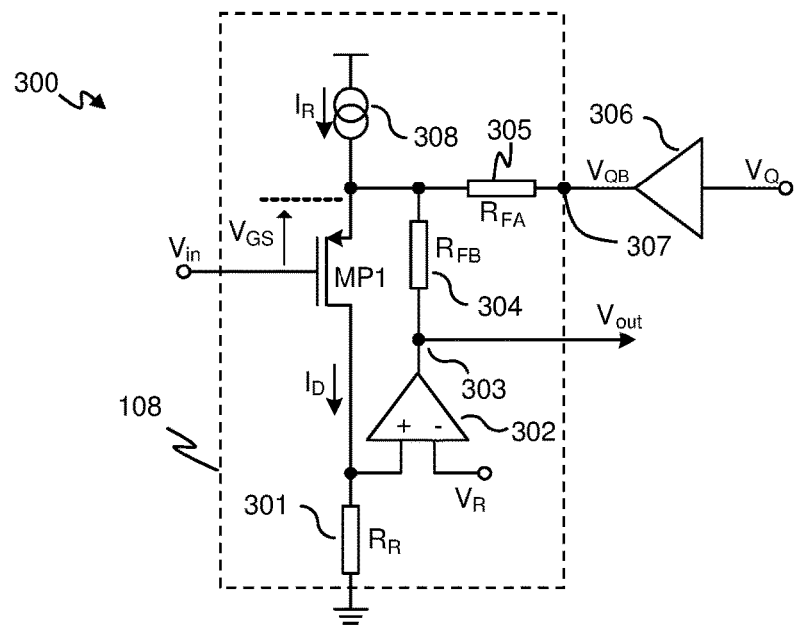
FIG. 3 illustrates an amplifier system that receives a defined buffered bias voltage from a voltage buffer.

FIG. 3 illustrates in more detail non-limiting example of an amplifier system 300 for amplifying an input signal $V_{in}$ from a capacitive transducer 101 (not illustrated) such as a MEMS microphone capacitive transducer which receives a defined quiescent bias voltage.

The input signal $V_{in}$ from the signal node 103, i.e. from one electrode of the capacitive transducer 101 is applied to the gate terminal or node of a transistor, in this example a MOS transistor MP1 although any equivalent device with suitable performance could be used. The drain connection or terminal of MP1 is connected via a resistor 301 to ground and to one input terminal (+) of op amp 302, whose other input terminal or node (−) is supplied with a reference voltage $V_R$. The output of amplifier 302 is supplied to an output node 303 for outputting the output signal $V_{out}$, which is the amplified version of the input signal $V_{in}$. The output of amplifier 302 is also coupled to the source terminal of transistor MP1 via resistor 304, thus closing a feedback loop around transistor MP1. This feedback resistor 304 may have a resistance value $R_{FB}$ in a similar manner to feedback resistor 202 described with reference to FIG. 2.

In operation, amplifier 302 modulates the voltage at the source of transistor MP1 and hence the drain current ($I_D$) of MP1 until the voltage across resistor 301 becomes equal to the reference voltage $V_R$, i.e. the drain current $I_D$ becomes equal to $V_R/R_R$ where $R_R$ is the resistance of resistor 301. The drain current of MP1 is thus maintained at a constant value despite any change in the gate voltage ($V_{in}$) applied to transistor MP1. This mean that the gate-source voltage of transistor MP1 remains constant and a signal-independent gate-source voltage ($V_{GS}$) appears across MP1, giving a gain of unity from the voltage $V_{in}$ on the gate node to the voltage on the source node. One skilled in the art will appreciate that in some respects this is similar to the topology and operation of a known super-source-follower configuration, however for a conventional super-source-follower the feedback resistor 304 would not be present, i.e. $R_{FB}$ would normally be a short or zero value resistance.

A further resistor 305 of value $R_{FA}$ is also connected between the source node of MP1 and the output of a voltage buffer 306. The voltage buffer 306 is supplied with an input quiescent bias voltage $V_Q$ and generates a buffered output quiescent bias voltage $V_{QB}$ at its output, i.e. at a buffer node 307.

In an example, the input quiescent bias voltage $V_Q$ may be chosen such that the buffered output quiescent bias voltage $V_{QB}$ is equal to the quiescent voltage on the source terminal of MP1, so that no voltage appears across the feedback resistor 305 and thus it passes zero quiescent current. Also a current source 308 may be connected to the source terminal of MP1, to generate a current $I_R$ with value equal to $V_R/R_R$, i.e. equal to the drain current $I_D$, so that it supplies exactly the current required by MP1. Then by Kirchhoff's Law the quiescent current through feedback resistor 304 is also zero, and the quiescent value of the output voltage $V_{out}$ will therefore equal the buffered quiescent bias voltage $V_{QB}$.

As an example of operation, if $V_{in}$ varies by say $DV_{in}$ from its quiescent value $V_{in0}$, the voltage on the source terminal of MP1 will also vary by $DV_{in}$ and a current $I_{IN}$ determined by $DV_{in}/R_{FA}$ will flow through resistor 305. This current $I_{IN}$ must be sourced via feedback resistor 304, and thus a voltage ($R_{FB} \cdot DV_{in}/R_{FA}$) therefore appears across resistor 304, giving a total change in voltage at the output node 303 of amplifier 302 of ($DV_{in}+R_{FB} \cdot DV_{in}/R_{FA}$). Thus a small signal voltage gain of $1+R_{FB}/R_{FA}$ is obtained, that is driven by amplifier 302. Amplifier 302 may be designed to adequately drive an anticipated load.

In an optimum design, the dominant noise source in the circuit will be the thermal noise of transistor MP1, and this noise will appear at the output node 303, i.e. the output of amplifier 302 as Vnrms·$(1+R_{FB}/R_{FA})$ where Vnrms is the gate-referred noise of MP1. However in a practical design, the voltage buffer 306 may be subject to similar restrictions of power, area and so forth and generate noise of a similar magnitude to that of transistor MP1. Also there may be significant noise already present on the input quiescent bias voltage $V_Q$ supplied to the voltage buffer 306. Input quiescent bias voltage $V_Q$ may be derived, for example, from an on-chip bandgap reference (not illustrated) which may have significant thermal noise, which may not be practicable to filter out, especially if there is no opportunity to use a large off-chip capacitance due to physical size restrictions or restrictions in an integrated circuit's pin count. Similarly to the circuit of FIG. 2, any noise present on the buffered quiescent bias voltage $V_{QB}$ will be gained up by a factor of $R_{FB}/R_{FA}$ at the output $V_{out}$: this output noise may be divided by the gain from $V_{in}$ to $V_{out}$ equal to $(1+R_{FB}/R_{FA})$ to provide a noise value referred to the input signal $V_{in}$. This noise present on $V_{QB}$ will thus appear scaled by $(R_{FB}/R_{FA})/(1+R_{FB}/R_{FA})$ and thus for relatively large values of the ratio $R_{FB}/R_{FA}$ (say 5 or 10) will appear at almost unity gain when referred to the input $V_{in}$.

Figure 4:
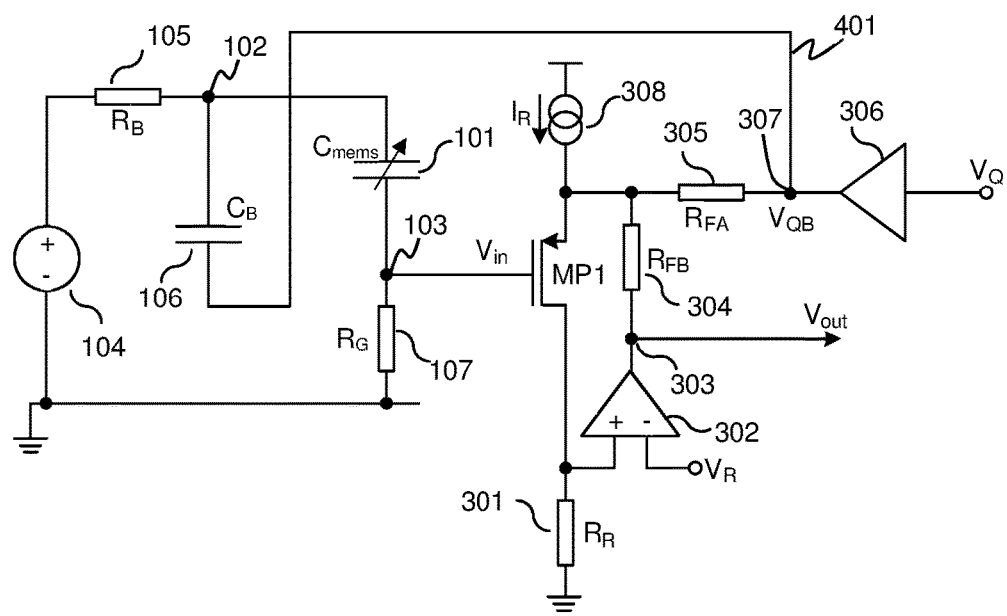
FIG. 4 illustrates an example of a capacitive transducer system according to an embodiment.

FIG. 4 illustrates an embodiment which substantially reduces the effect of any noise present on the buffered quiescent bias voltage $V_{QB}$. The topology and operation of the circuit illustrated in this FIG. 4 is similar to that already described in respect of FIG. 3 and similar components will be identified by the same reference numerals as used previously. In the embodiment of FIG. 4 the second electrode of bias filter capacitor 106 is connected, via signal path 401, to the buffered bias voltage $V_{QB}$, i.e. to the buffer node 307 at the output of the voltage buffer 306, rather than to ground. Such a connection has no effect on the signal gain from $V_{in}$ to $V_{out}$. However, any perturbation in the buffered quiescent bias voltage $V_{QB}$, i.e. any noise, will now, due to said signal path 401, propagate via bias filter capacitor 106 to the transducer biasing node 102, and thus to the transducer 101 itself, e.g. the first electrode of the transducer 101. Any such perturbation will thus also propagate to the signal node 103 and to the gate terminal of transistor MP1, i.e. a perturbation in the buffered quiescent bias voltage $V_{QB}$ will result in a corresponding perturbation in the voltage $V_{in}$ at the signal node 103. As noted above transistor MP1 is configured to provide a constant gate-source voltage and thus the perturbation in gate voltage will give rise to an equal perturbation to the voltage at the source node of transistor MP1. Thus the voltage across resistor 305 will advantageously be unchanged as both terminals of this resistor will experience the same perturbation. The current through resistor 305 will also remain unchanged, thus the voltage across feedback resistor 304 will also be unchanged, and the perturbation at the source of transistor MP1 will propagate directly to the output terminal 303 that supplies the output voltage $V_{out}$.

Thus the voltage gain from the output of the voltage buffer 306, that outputs the buffered quiescent bias voltage $V_{QB}$, to the output node 303 of the amplifier 302, that outputs the output voltage $V_{out}$, will only be unity, whereas there will be a signal gain between signal node 103 and output node 303, i.e. from $V_{in}$ to $V_{out}$, of $(1+R_{FB}/R_{FA})$. Thus the noise component in the buffered quiescent bias voltage $V_{QB}$ appearing at $V_{out}$ (or equivalently $V_{in}$) will appear at the output with only unity gain, whereas the gate-referred noise of MP1 will be gained up by the same gain as the signal, i.e. $(1+R_{FB}/R_{FA})$. In other words, the noise component in the buffered quiescent bias voltage $V_{QB}$ will be attenuated by a factor $(1+R_{FB}/R_{FA})$ when noise is referred to the input signal node 103.

For example, if $R_{FB}/R_{FA}$ is equal to 4 say, the signal gain will be a factor of 5. Since the noise contributions due to the transistor MP1 and the voltage buffer 306 are uncorrelated, they will add in a root-mean-square fashion. The overall noise (referenced to the input signal $V_{in}$) will thus effectively be the root-mean-square of the transistor noise and the attenuated buffer noise. Assuming equal noise due to transistor MP1 and voltage buffer 306, then for the example above where the signal path gain (and effective attenuation of the buffer noise) is equal to 5, the overall noise will only be degraded in voltage terms by a factor $\sqrt{(1+1/25)}=1.02$. In other words there will be of the order of a 2% degradation in noise voltage due to the voltage buffer 306 compared to the contribution from the transistor MP1 alone.

This arrangement thus provides a quiescent bias voltage to allow definition of the quiescent voltage of the amplifier system but does so in way such that quiescent bias voltage does not add any significant noise, that is the impact of any noise associated with the quiescent bias voltage is relatively low in the output signal from the amplifier system.

In some cases, for example where the downstream circuitry (not illustrated) has a differential-input, this downstream circuitry may be able to accept the buffered quiescent bias voltage $V_{QB}$ from the voltage buffer 306 as a secondary input and effectively subtract it.

Although the capacitance $C_B$ of the bias filter capacitor 106 may be quite high in value for an on-chip load, say of the order of 50 pf or so, the load it presents to the voltage buffer 306 is in series with the MEMS capacitance 101, which may only be of the order of 1 pf, and also in series with the input capacitance of transistor MP1 plus any strays capacitances on the gate node of transistor MP1. Therefore the effective extra load capacitance as seen by the voltage buffer 306 will be less than the capacitance of the MEMS transducer 101, i.e. typically lower than 1 pf.

Figure 5:
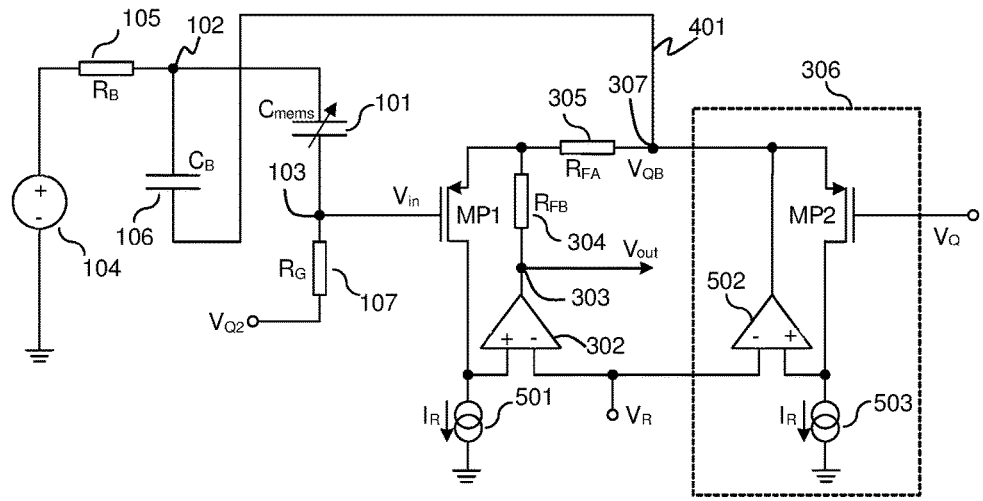
FIG. 5 illustrates an example of a capacitive transducer system according to an embodiment and illustrates one example of voltage buffer in more detail.

FIG. 5 illustrates another embodiment, again where similar component are identified by the same reference numerals. In this example current sink 501 is connected to the drain of transistor MP1 and, as compared to the embodiment of FIG. 4 can be seen as replacing the resistor 301. In this embodiment current sink 501 defines the quiescent current through transistor MP1 via the feedback loop around transistor MP1 and thus through amplifier 302. Provided that reference voltage $V_R$ is chosen so as to provide adequate operating headroom for the current sink, the reference voltage $V_R$ does not affect the current provided by current sink 165, or thus the quiescent current through MP1. This avoids a sensitivity to any noise on the reference voltage $V_R$.

In the example of FIG. 5 there is no current source connected to the source of transistor MP1 to provide the quiescent current, i.e. the current source 308 of the embodiment of FIG. 4 is omitted. This eliminates current source 308 as a possible contributor of noise. As noted any quiescent current required is provided instead from amplifier 302 via feedback resistor 304 and/or the voltage buffer 306 via resistor 305. Such a circuit configuration will impact the D.C. conditions of the amplifier system, and in particular will impose a voltage drop from $V_{out}$ to the source terminal of transistor MP1. Additionally or alternatively however a current source could be connected to provide some or all of a required current to the source of transistor MP1 as described with reference to FIG. 4.

Also, in the example of FIG. 5, voltage buffer 306 comprises a second transistor MP2, amplifier 502, and current sink 503. The second transistor MP2 and amplifier 502 and current sink 503 operate analogously to transistor MP1, amplifier 302, and current sink 501 respectively to provide a super-source-follower configuration to provide a low output impedance at the voltage buffer output.

In the example voltage buffer 306 illustrated in FIG. 5 the quiescent current for second transistor MP2 is provided by amplifier 502. In a similar manner as discussed above for MP1 however there could be a current source connected to the source of MP2 to provide the required current, e.g. analogous to current source 308. If a current source is provided then current sink 503 may, in some instances be replaced with a resistor analogous to resistor 301. A current source could be connected to the source of MP2 whether or not there is a current source 308 connected to the source of MP1. In some implementations a current source may be present at only one or other of the source terminal of MP1 or the source terminal of MP2 and there may also be a quiescent voltage drop across feedback resistor 305.

These quiescent voltage drops, e.g. between $V_{out}$ and the source of MP1 and/or across resistor 305 may be advantageous in providing the designer with a degree of freedom in tailoring the required quiescent and operating voltages of nodes of the circuit.

FIG. 5 further illustrates that the impedance 107 connected to the signal node 103 may generally be connected to a defined voltage $V_{Q2}$. This defined voltage $V_{Q2}$ may be zero, i.e. ground, in a similar fashion as described previously. In some instances however the reference voltage $V_{Q2}$ may be a non-zero reference voltage and may in particular be equal to the input quiescent bias voltage $V_Q$.

It should be noted that the discussion above has focused on the input quiescent bias voltage $V_Q$ being a non-zero voltage to, at least partly, define the quiescent output voltage of the amplifier arrangement 108. In some embodiments however the input quiescent bias voltage $V_Q$ may be zero, i.e. ground. A ground terminal may still experience noise and the principles described above will avoid such noise having a significant component in the output signal. Moreover, the principles described above will also reduce the effect of any noise of any buffer amplifier required, for example the noise of transistor MP2 and other components of buffer 306 of FIG. 5.

Figure 6:
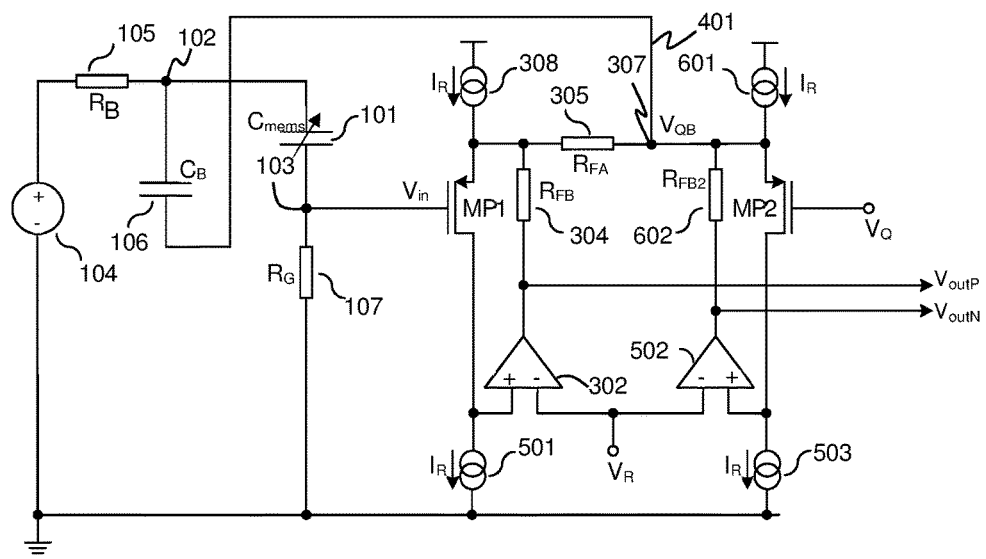
FIG. 6 illustrates an example of a capacitive transducer system with differential outputs.

FIG. 6 illustrates a further embodiment. This circuit is generally similar in topology and operation to that of FIG. 5 except that the current source 308 is present to supply current to the source of MP1 and a companion current source 601 is connected to the source of MP2. If the values of these current sources are equal to those of the corresponding current sinks 501 and 503 there will be zero quiescent current supplied by amplifiers 302 and 502.

Also an additional feedback resistor 602, of resistance $R_{FB2}$ is provided between the output of amplifier 502 and the source terminal of MP2. The output of amplifier 502 may then be used as a complementary output $V_{outN}$ to the voltage output from amplifier 302 (shown in FIG. 6 as an output $V_{outP}$). If the currents provided by current sources 308 and 601 are each equal to each other and to the current through the respective current sinks 501 and 503 there will be no quiescent current through the feedback resistors 304, 305 or 602, and the quiescent voltage on outputs $V_{outP}$ and $V_{out}$ Nwill quiescently be equal to the buffered quiescent bias voltage $V_{QB}$. If the input voltage $V_{in}$ rises by $\Delta V_{in}$ this change in voltage will be imposed across feedback resistor 305 and a current $I_{305}$ determined by $\Delta V_{in}/R_{FA}$ will flow through feedback resistor 305. This current $I_{305}$ must be sourced via feedback resistor 304 and as a result a voltage determined by $R_{FB} \cdot \Delta V_{in}/R_{FA}$ appears across feedback resistor 304, giving a total change in voltage at $V_{outP}$ of $\Delta V_{in} + R_{FB} \cdot \Delta V_{in}/R_{FA}$. Similarly, this current must be sunk by feedback resistor 602. The source terminal of MP2 is clamped at a constant voltage, i.e. $V_{QB}$, so $V_{outN}$ will drop in voltage by $R_{FB2} \cdot \Delta V_{in}/R_{FA}$. Thus signal voltages of opposite polarity will appear at the outputs $V_{outP}$ and $V_{outN}$. If the values of feedback resistors 304 and 602, i.e. $R_{FB2}$ and $R_{FB}$, are equal then there will be a small difference in amplitude of the output voltages at $V_{outP}$ and $V_{outN}$, but this may be tolerable depending on the common-mode behavior of anticipated downstream circuitry. Alternatively, the value $R_{FB2}$ of feedback resistor 602 may be chosen to be increased compared to the resistance $R_{FB}$ of resistor 304, so as to provide the same amplitude signal at each of the complementary outputs $V_{outP}$ and $V_{outN}$: therefore, in such a situation, the values of $R_{FB}$ and $R_{FB2}$ of feedback resistors 304 and 602 will be different.

In this example the source terminal of MP2 is connected to the bias filter capacitor 106 via the signal path 401. As discussed previously this has no effect on the noise or signal gain from $V_{in}$. However, any perturbation, i.e. noise, in the buffered quiescent bias voltage $V_{QB}$ will propagate to the gate of MP1, from where it will give an equal perturbation to the voltage on the source of MP1 as described above. Thus the voltage across resistor 305 will be unchanged and the current through each of the feedback resistor 304 and the additional feedback resistor 602 will also remain unchanged. Thus the voltage across each the resistors 304 and 602 will be unchanged, and the perturbation on the source of MP1 will propagate directly and equally to the complementary outputs $V_{outP}$ and $V_{outN}$. Thus any noise on the buffered bias voltage $V_{QB}$, due for example to thermal noise of transistor MP2 or noise present on the bias voltage $V_Q$, will propagate symmetrically to the outputs $V_{outP}$ and $V_{outN}$. There will thus be zero resulting differential signal. Any noise will only appear as a common mode component and may be rejected by the common-mode rejection of an appropriate downstream circuit.

The embodiment of FIG. 6 illustrates current sources 308 and 601 to provide the required current for MP1 and MP2 respectively. In some embodiments however these current sources may be omitted to avoid any noise contribution.

In some embodiments amplifiers 302 and 502 may be replaced with a single differential-output amplifier with common mode feedback. The differential amplifier may receive the voltage reference $V_R$ as a defined common mode input and provide an output to supply a biasing current to node 307. To ensure equal current for MP1 and MP2, and equal currents through feedback resistors 304 and 602, a resistor with a value $R_{F4}$ equal to the resistance of resistor 305, may be included between node 307 and the source of MP2 and between node 307 and resistor 602.

Figure 7:
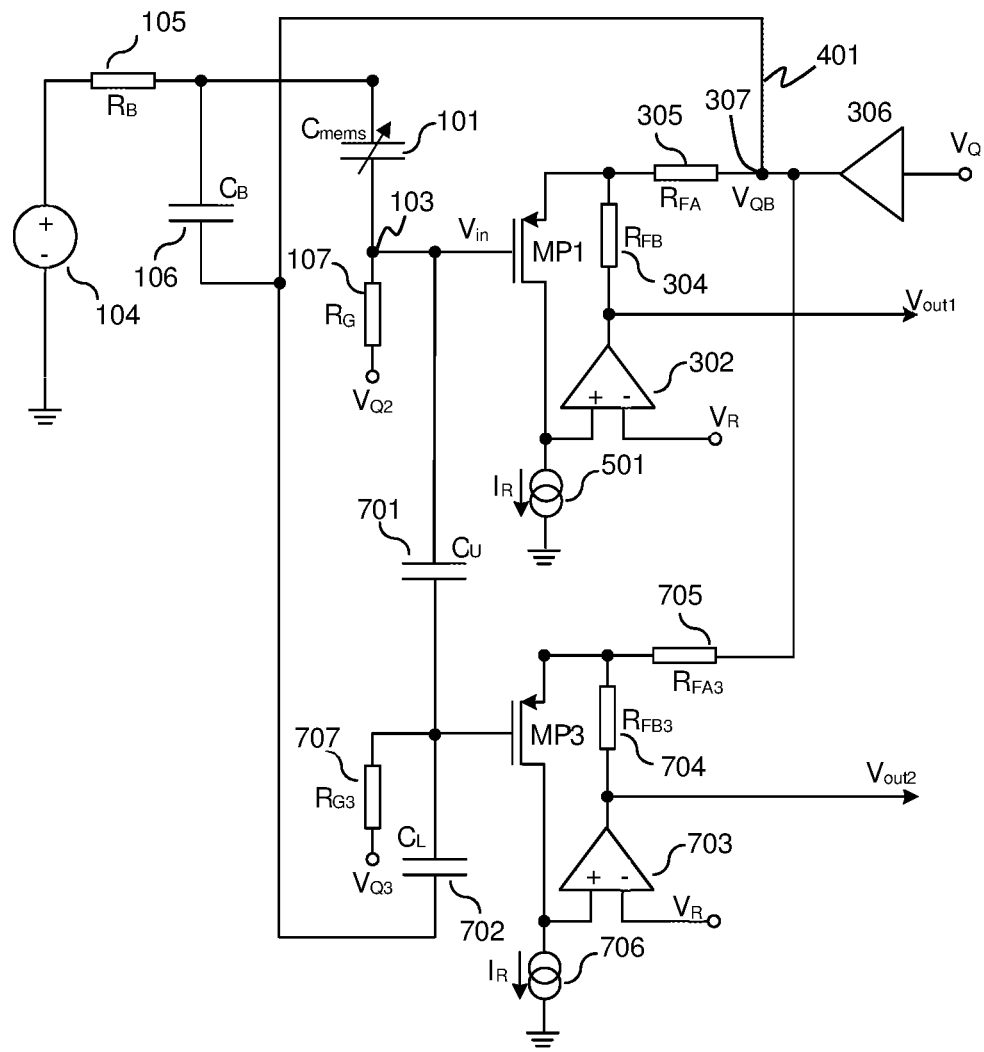
FIG. 7 illustrates an example of a capacitive transducer system with multiple outputs for different sensitivity.

FIG. 7 illustrates a further embodiment of an amplifier system having dual outputs $V_{out1}$ and $V_{out2}$. For the output Vout1 the input signal $V_{in}$ from the signal node 103 is supplied to transistor MP1 which is coupled to amplifier 302 and feedback resistors 304 and 305, with one terminal of feedback resistor 305 being coupled to receive the buffered quiescent bias voltage $V_{QB}$ from voltage buffer 306 as described previously. The output of voltage buffer 306 is also coupled via signal path 401 to the transducer biasing node 102 via bias filter capacitor 106.

In addition the input signal $V_{in}$ from the sense node is also supplied to a capacitive potential divider formed by capacitors 701 and 702. The midpoint of this potential divider is supplied as a gate voltage to transistor MP3 which is connected with amplifier 703 and feedback resistors 704 and 705 and current sink 706 to operate in the same way as discussed above to provide the second output $V_{out2}$. The buffered quiescent bias voltage is thus also supplied to a terminal of feedback resistor 705. The midpoint of the potential divider is biased with a reference voltage $V_{Q3}$ via impedance 707.

The capacitive potential divider thus effectively means that an attenuated version of the input signal $V_{in}$ at the signal node is supplied to the gate of transistor MP3. For transducer systems where a high dynamic range is required, it may be difficult to provide both high dynamic range and good SNR at low signal levels in one signal processing path. The arrangement of FIG. 7 means that the components generating the first output $V_{out1}$ and downstream processing can be designed for operation up to a certain input signal level, below the maximum signal level. This signal processing path may be optimized for lower signal levels to provide good SNR. At higher signal levels, which may cause clipping or the like in the first signal path the second output may be used instead with the input for this signal processing path having been attenuated to an appropriate level. Downstream processing may decide which output to use and may compensate for any change in gain involved in swapping from one output to the other.

The attenuated input signal thus drives the gate of transistor MP3 in the same way as discussed above to generate the second output $V_{out2}$. As mentioned one end of the capacitive potential divider formed by capacitors 702 and 703 is connected to receive the input signal from the signal node 103. The other end of this capacitive potential divider is coupled to receive the buffered quiescent bias voltage $V_{QB}$. Any perturbation in the buffered quiescent bias voltage $V_{QB}$ thus appears on both ends of the potential divider and thus does not impact the division ratio. The full perturbation will thus appear at the gate input to transistor MP3 and thus also appears at the source node of this terminal. The gain between the buffered quiescent bias voltage $V_{QB}$ node and the second output is thus unity whereas the signal path gain between the gate input the transistor MP3 and the second output is determined by resistors 703 and 704 and can be greater than unity as discussed above. The advantages of reduction of any noise contribution from the buffered bias voltage to the output thus also apply to this second signal path.

The embodiments above, particularly those described with respect to FIGS. 4, 5, 6 and 7 thus provide an amplifier system for a capacitive transducer that provides gain with respect to a quiescent bias voltage while removing some or all of the noise contribution attributable to a quiescent voltage reference. This may remove any requirement for off-chip components to filter or generate a suitable low-noise reference or to reduce the area or power consumption needed to generate a low noise reference. The amplifier system may be integrated on a single integrated circuit (IC), i.e. it may be a monolithic IC, which may be co-packaged with a separately manufacture transducer 10, all housed within a common enclosure or package or alternatively as two separate semiconductor die where at least part of the exterior of the chip-level package thus formed comprises a surface of one or both die. The amplifier system may be integrated on the same semiconductor die as the transducer and both amplifier system and transducer may usefully employ at least one common layer of material.

The amplifier system may be co-integrated with analog or digital signal conditioning circuitry such as analogue or digital filters or analog-to-digital converters or a general purpose programmable digital signal processor and may have on-chip storage for executable program instructions for various applications.

The embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Examples may also be used in voice activated or voice controlled devices. Typical medical applications include hearing aids. Typical industrial applications include active noise cancellation. Typical automotive applications include hands-free sets, acoustic crash sensors and active noise cancellation.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element. Further embodiments likewise, with the benefit of this disclosure, will be apparent to those having ordinary skill in the art, and such embodiments should be deemed as being encompassed herein.

The invention claimed is:

1. An amplifier circuit for amplifying an input signal from a capacitive transducer comprising:
   a transducer biasing node for outputting a transducer bias voltage for biasing the capacitive transducer;
   a signal node for receiving the input signal from the capacitive transducer;
   an amplifier arrangement coupled to the signal node to amplify the input signal and generate an output signal at an output node, the amplifier arrangement comprising a feedback resistor network;
   a voltage buffer configured to generate a buffered bias voltage at a buffer node;
   wherein a terminal of the feedback resistor network is electrically coupled to the buffer node to receive said buffered bias voltage; and
   a first capacitance is electrically coupled between the transducer biasing node and the buffer node.

2. An amplifier circuit as claimed in claim 1 wherein the amplifier arrangement comprises an input transistor coupled so as to be driven by the input signal at the signal node.

3. An amplifier circuit as claimed in claim 2 wherein the amplifier arrangement further comprises a first amplifier and the feedback resistor network comprises first and second resistors, wherein:
   the input transistor comprises:
      a gate terminal coupled to the signal node;
      a drain terminal coupled to a first input of the first amplifier; and
      a source terminal connected to an output of the first amplifier via the first resistor;
   a second input of the first amplifier is connected to receive a defined reference voltage;
   the output of the first amplifier is coupled to the output node;
   the first resistor is coupled between the output of the first amplifier and the source terminal of the input transistor; and
   the second resistor is coupled between the buffer node and the source terminal of the input transistor.

4. An amplifier circuit as claimed in claim 3 further comprising a first current source coupled to the source terminal of the input transistor for sourcing a defined current.

5. An amplifier circuit as claimed in claim 4 comprising an additional resistor connected between the drain terminal of the input transistor and a defined voltage.

6. An amplifier circuit as claimed in claim 3 further comprising a first current sink coupled to the drain terminal of the input transistor for sinking a defined current.

7. An amplifier circuit as claimed in claim 3 wherein the voltage buffer comprises a buffer transistor coupled to be driven by an input quiescent bias voltage.

8. An amplifier circuit as claimed in claim 7 wherein the voltage buffer further comprises a second amplifier, wherein:
   a gate terminal of the buffer transistor is coupled to receive the input quiescent bias voltage,
   a drain terminal of the buffer transistor is coupled to an input of the second amplifier;
   a source terminal of the buffer transistor is coupled to the output of the second amplifier and to the buffer node; and
   a second input of the second amplifier is connected to receive the defined reference voltage.

9. An amplifier circuit as claimed in claim 8 wherein the output of the second amplifier is connected to the buffer node and the source terminal of the buffer transistor via a third resistor.

10. An amplifier circuit as claimed in claim 9 wherein the output of the second amplifier is output at a complementary output node as a complementary output signal.

11. An amplifier circuit as claimed in claim 1 wherein the signal node is connected, in use, to a signal node bias voltage via a signal node impedance.

12. An amplifier circuit as claimed in claim 1 further comprising:
   a potential divider having first and second ends, the first end coupled to the signal node and configured to generate an attenuated version of the signal at the signal node;
   a second amplifier arrangement coupled to the potential divider to amplify the attenuated input signal and generate a second output signal at a second output node, the second amplifier arrangement comprising a second feedback resistor network; and
   wherein a terminal of the second feedback resistor network is electrically coupled to the buffer node to receive said buffered bias voltage; and
   wherein the second end of the potential divider is electrically coupled to buffer node.

13. An amplifier circuit as claimed in claim 12 wherein the potential divider is a capacitive potential divider.

14. An amplifier circuit as claimed in claim 1 wherein the first capacitor forms part of a filter for filtering the transducer bias voltage.

15. An amplifier circuit as claimed in claim 1 comprising a capacitive transducer connected between the transducer biasing node and the signal node.

16. An amplifier circuit as claimed in claim 15 where the capacitive transducer is a MEMS capacitive transducer.

17. An amplifier circuit as claimed in claim 15 wherein the capacitive transducer is integrated with the amplifier circuit in an integrated circuit.

18. An electronic device comprising an amplifier circuit as claimed in claim 1 wherein the electronic device is at least one of: a communications device; a mobile or cellular telephone; a smartphone device; a computing device; a laptop, notebook or tablet computer; a portable device; a battery powered device; a wearable device; a voice-operated device; a gaming device.

19. An amplifier apparatus comprising:
   a MEMS capacitive transducer connected between a transducer biasing node and a signal node;

an amplifier arrangement coupled to the signal node to amplify the input signal, the amplifier arrangement comprising a feedback resistor network; and a voltage buffer configured to generate a buffered bias voltage at a buffer node;

wherein a terminal of the feedback resistor network is electrically coupled to the buffer node to receive said buffered bias voltage;

a signal path between the buffer node and the transducer biasing node comprising a first capacitor.

20. An amplifier circuit for amplifying an input signal from a capacitive transducer comprising:

a signal node for receiving the input signal;

a transducer biasing node for outputting a transducer bias voltage for biasing the capacitive transducer;

an input transistor having a gate terminal coupled to the signal node;

an amplifier having an input connected to a drain terminal of the input transistor and an output connected to a source terminal of the input transistor via a first feedback resistor;

a defined current element for defining a gate-to-drain current through the input transistor;

a voltage buffer configured to generate a buffered bias voltage at a buffer node;

a second feedback resistor connected between the buffer node and the source terminal of the input transistor; and a first capacitance electrically coupled between the transducer biasing node and the buffer node.

* * * * *

UNITED STATES PATENT AND TRADEMARK OFFICE
CERTIFICATE OF CORRECTION

PATENT NO. : 10,455,331 B2
APPLICATION NO. : 15/916597
DATED : October 22, 2019
INVENTOR(S) : Saman et al.

Page 1 of 1

It is certified that error appears in the above-identified patent and that said Letters Patent is hereby corrected as shown below:

In the Claims

Please amend Claim 8 as follows:
8. An amplifier circuit as claimed in claim 7 wherein the voltage buffer further comprises a second amplifier, wherein:
a gate terminal of the buffer transistor is coupled to receive the input quiescent bias voltage;
a drain terminal of the buffer transistor is coupled to an input of the second amplifier;
a source terminal of the buffer transistor is coupled to the output of the second amplifier and to the buffer node; and
a second input of the second amplifier is connected to receive the defined reference voltage.

Please amend Claim 15 as follows:
15. An amplifier circuit as claimed in claim 1 comprising the capacitive transducer connected between the transducer biasing node and the signal node.

Signed and Sealed this
Fifth Day of May, 2020

Andrei Iancu
*Director of the United States Patent and Trademark Office*